United States Patent [19]
Suzuki et al.

[11] Patent Number: 5,821,838
[45] Date of Patent: Oct. 13, 1998

[54] DOUBLE TUNING CIRCUIT OF TV TUNER

[75] Inventors: Takeo Suzuki; Masaki Yamamoto; Masashi Suzuki; Yasuharu Kudo, all of Fukushima-ken, Japan

[73] Assignee: Alps Electric Co., Ltd., Japan

[21] Appl. No.: 763,638

[22] Filed: Dec. 4, 1996

[30] Foreign Application Priority Data

Dec. 8, 1995 [JP] Japan ................................. 7-320624

[51] Int. Cl.⁶ ........................................................ H03J 5/00
[52] U.S. Cl. ............................ 334/47; 334/55; 455/180.2; 455/188.2
[58] Field of Search ..................................... 333/174, 177, 333/178, 28 R; 334/1, 3, 47, 55; 455/180.1, 180.2, 180.3, 185.1, 188.1, 188.2, 191.1, 191.3, 307

[56] References Cited

FOREIGN PATENT DOCUMENTS 61-103308 5/1986 Japan .

*Primary Examiner*—Paul Gensler
*Attorney, Agent, or Firm*—Brinks Hofer Gilson & Lione

[57] ABSTRACT

The double tuning circuit of a TV tuner provided by the present invention comprises a primary tuning circuit and a secondary tuning circuit coupled with each other wherein at least one of the primary and secondary tuning circuits comprises two series circuits connected to each other in parallel with each of the two series circuits including damping resistors and/or resonance capacitors in addition to switching diodes which are each selectively turned on and off by using a predetermined switching voltage corresponding to signal reception states so that the frequency response of an intermediate-frequency signal obtained on the output side of the double tuning circuit is fixed independently of a channel receiving the incoming signal and the intensity of the electric field of the incoming signal.

9 Claims, 9 Drawing Sheets

FIG. 2A-a
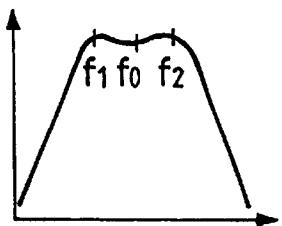
FIG. 2A-b
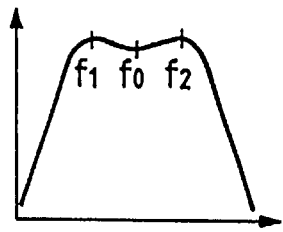
FIG. 2A-c
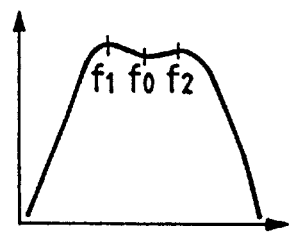
FIG. 2B-a
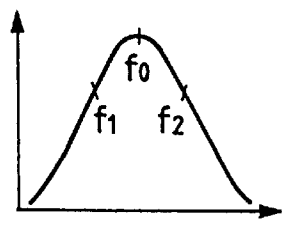
FIG. 2B-b
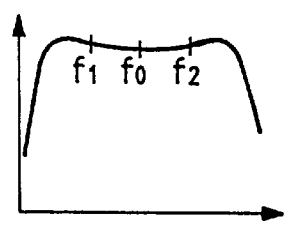
FIG. 2B-c
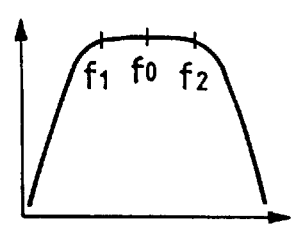
FIG. 2C-a
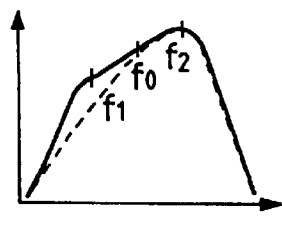
FIG. 2C-b
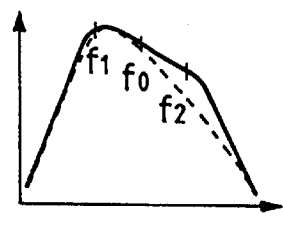
FIG. 2C-c
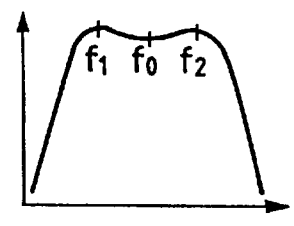
FIG. 2D-a
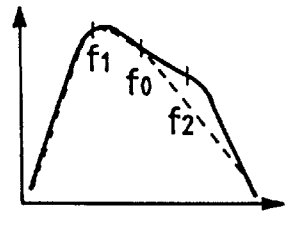
FIG. 2D-b
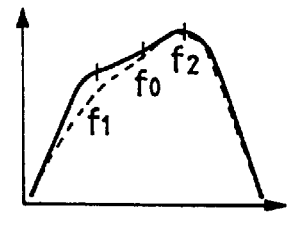
FIG. 2D-c
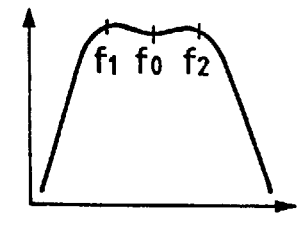
FREQUENCY RESPONSE OF A SIGNAL OUTPUT BY THE FREQUENCY CONVERTING UNIT
FREQUENCY RESPONSE OF THE DOUBLE TUNING CIRCUIT
FREQUENCY RESPONSE OF A SIGNAL OUTPUT BY THE DOUBLE TUNING CIRCUIT

FIG. 3

| PORT TYPE | BS5 | BS6 | BS7 | BS8 |
|---|---|---|---|---|
| 1 | OFF | OFF | OFF | OFF |
| 2 | ON | ON | ON | ON |
| 3 | OFF | OFF | ON | OFF |
| 4 | OFF | OFF | ON | ON |
| 5 | ON | OFF | OFF | OFF |
| 6 | ON | ON | OFF | OFF |

FIG. 6

| PORT TYPE | BS5 | BS6 | BS7 | BS8 |
|---|---|---|---|---|
| 1 | ON | OFF | ON | OFF |
| 2 | ON | OFF | OFF | OFF |
| 3 | OFF | OFF | ON | OFF |
| 4 | ON | ON | ON | ON |
| 5 | OFF | OFF | OFF | OFF |
| 6 | OFF | OFF | ON | ON |
| 7 | ON | ON | OFF | OFF |

*FIG.5A-a*     *FIG.5A-b*     *FIG.5A-c*
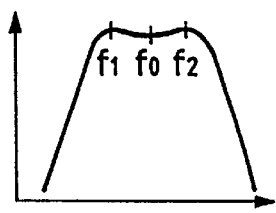 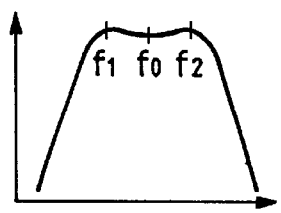 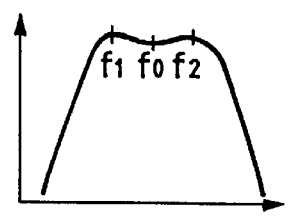
*FIG.5B-a*     *FIG.5B-b*     *FIG.5B-c*
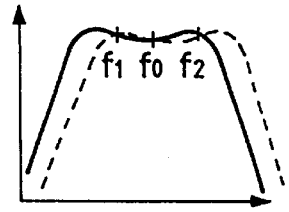 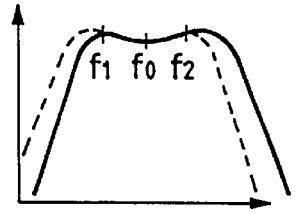 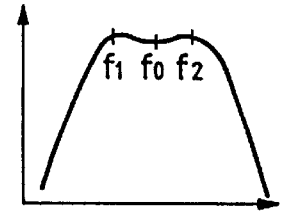
*FIG.5C-a*     *FIG.5C-b*     *FIG.5C-c*
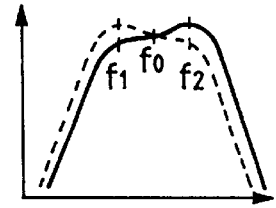 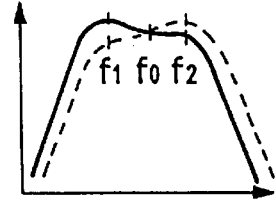 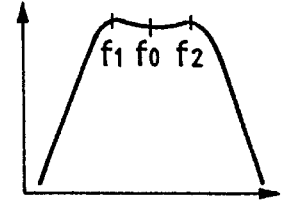
*FIG.5D-a*     *FIG.5D-b*     *FIG.5D-c*
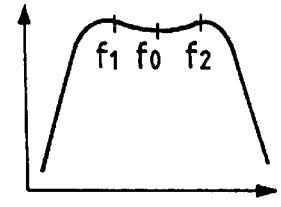 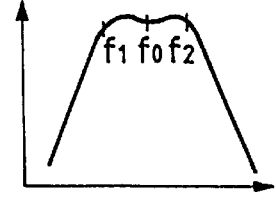 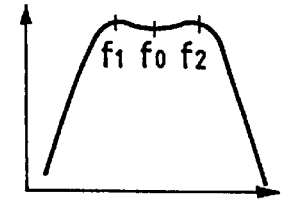
*FIG.5E-a*     *FIG.5E-b*     *FIG.5E-c*
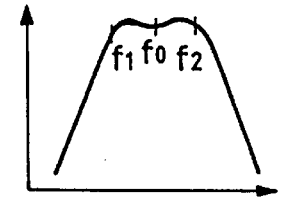 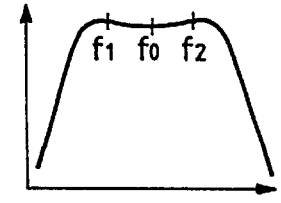 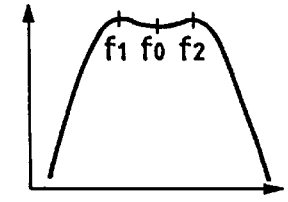
FREQUENCY RESPONSE OF A SIGNAL OUTPUT BY THE FREQUENCY CONVERTING UNIT
FREQUENCY RESPONSE OF THE DOUBLE TUNING CIRCUIT
FREQUENCY RESPONSE OF A SIGNAL OUTPUT BY THE DOUBLE TUNING CIRCUIT

FIG.8A-a
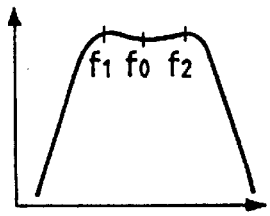
FIG.8A-b
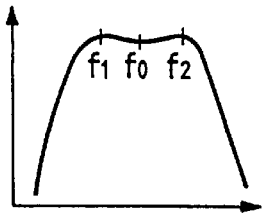
FIG.8A-c
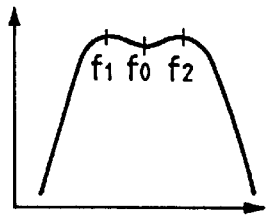
FIG.8B-a
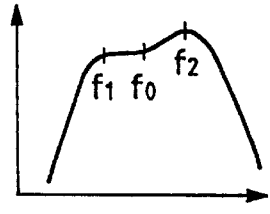
FIG.8B-b
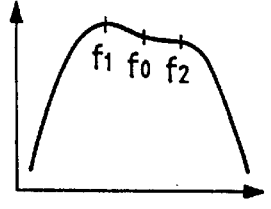
FIG.8B-c
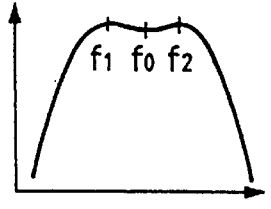
FIG.8C-a
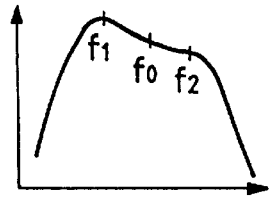
FIG.8C-b
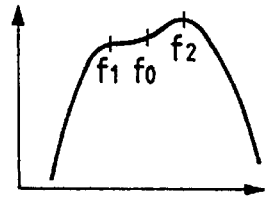
FIG.8C-c
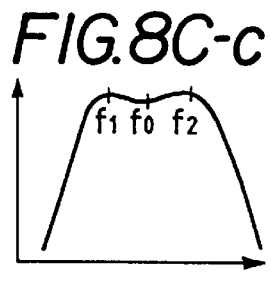
FIG.8D-a
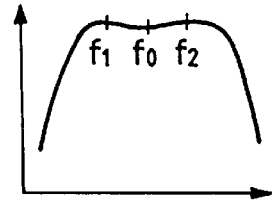
FIG.8D-b
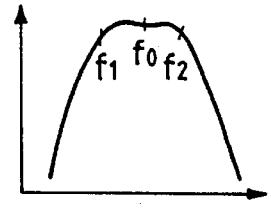
FIG.8D-c
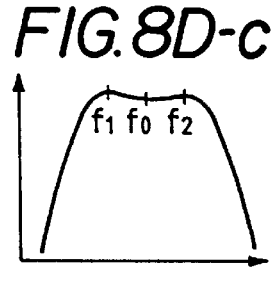
FIG.8E-a
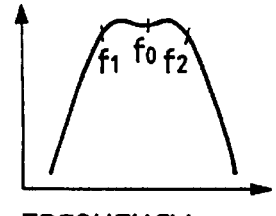
FIG.8E-b
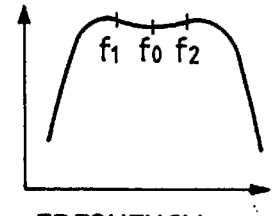
FIG.8E-c
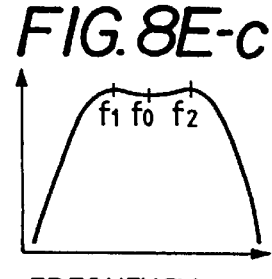
FREQUENCY RESPONSE OF A SIGNAL OUTPUT BY THE FREQUENCY CONVERTING UNIT
FREQUENCY RESPONSE OF THE DOUBLE TUNING CIRCUIT
FREQUENCY RESPONSE OF A SIGNAL OUTPUT BY THE DOUBLE TUNING CIRCUIT

| PORT TYPE | BS5 | BS6 | BS7 | BS8 |
|---|---|---|---|---|
| 1 | OFF | ON | ON | OFF |
| 2 | ON | OFF | ON | OFF |
| 3 | OFF | OFF | ON | ON |
| 4 | ON | OFF | OFF | OFF |
| 5 | OFF | ON | OFF | OFF |

DOUBLE TUNING CIRCUIT OF TV TUNER

BACKGROUND OF THE INVENTION

The present invention relates to a double tuning circuit employed in a TV (television) tuner. In particular, the present invention relates to a double tuning circuit employed in a TV tuner for improving a frequency response of a signal output by the TV tuner by automatically correcting variations in frequency-versus-amplitude characteristics (or variations in frequency response) of an intermediate-frequency signal output by a frequency-conversion unit of the TV tuner.

In general, a TV-tuner comprises a high-frequency amplifier unit for amplifying an incoming signal received by a receiving antenna, a frequency-conversion unit for producing a compound signal by carrying out frequency mixing of the incoming signal and a local oscillation signal, a local oscillator for generating the local oscillation signal, an intermediate-frequency selecting unit for selecting an intermediate-frequency signal from the compound signal, and an intermediate-frequency amplifier unit for amplifying the intermediate-frequency signal. The intermediate-frequency selecting unit which is normally implemented as a double tuning circuit corresponds to an intermediate-frequency transformer.

FIG. 10 is a circuit diagram showing a typical configuration of a double tuning circuit, that is, the already known intermediate-frequency selecting unit. FIG. 11 is a characteristic diagram showing an example of an ideal frequency response to an intermediate-frequency signal output by the double tuning circuit cited above.

As shown in FIG. 10, the double tuning circuit comprises a primary tuning circuit 51 and a secondary tuning circuit 52. The input terminal of the primary tuning circuit 51 is connected to the output terminal of a frequency-conversion unit at the preceding stage whereas the output terminal of the secondary tuning circuit 52 is connected to the input terminal of an intermediate-frequency amplifier unit at the succeeding stage. The primary tuning circuit 51 comprises a first variable inductor 53, a first capacitor 54 and a first damping resistor 55 which are connected to each other in parallel. By the same token, the secondary tuning circuit 52 comprises a second variable inductor 56, a second capacitor 57 and a second damping resistor 58 which are connected to each other in parallel. The first and second variable inductors 53 and 56 are inductively coupled with each other to create a double tuning circuit.

The vertical axis in FIG. 11 represents the amplitude of an output signal whereas the horizontal axis represents the frequency. A point P in the pass band is a point coinciding with a resonance frequency of the primary tuning circuit 51. Likewise, a point S is a point coinciding with a resonance frequency of the secondary tuning circuit 52.

Normally, in the double tuning circuit, by adjusting the inductance values of the first and second variable inductors 53 and 56 and, thus, the inductive-coupling state thereof, an intermediate-frequency signal having an ideal frequency response as shown in FIG. 11 can be obtained on the output side of the double tuning circuit.

Normally, however, in a TV tuner, the frequency response of an intermediate-frequency signal output by the frequency-conversion unit thereof varies depending upon the reception channel of the TV tuner. On the top of that, even for the same reception channel, if the amplification of the high-frequency amplifier unit is changed by automatic gain control (AGC), the frequency response also changes in accordance with the change in amplification.

By the way, with a double tuning circuit employed as an intermediate-frequency selecting unit of a TV tuner, the double tuning circuit is adjusted as described above in reception of a signal for a certain channel so that an intermediate-frequency signal obtained on the output side of the double tuning circuit has an ideal response characteristic like the one shown in FIG. 11. None the less, when the level of the incoming signal changes, causing a voltage of the automatic gain control applied to the high-frequency amplifier unit to change as well, the amplification of the high-frequency amplifier unit also changes, varying the frequency response of the intermediate-frequency signal output by the frequency-conversion unit. The frequency response also changes when the reception of a signal is switched from a channel to another one. As a result, the intermediate-frequency signal obtained on the output side of the double tuning circuit does not necessarily display an ideal frequency response as shown in FIG. 11. When the frequency response of an intermediate-frequency signal obtained on the output side of the double tuning circuit deviates much from the ideal one, correction by the intermediate-frequency amplifier unit is no longer possible. As a result, the frequency response of a signal output by the TV tuner is not appropriately usable.

As described above, the double tuning circuit has a problem that it can not keep up with a change in frequency response happening to the intermediate-frequency signal output by the frequency-conversion unit. In reception of a digital signal, this problem is particularly a serious problem.

SUMMARY OF THE PRESENT INVENTION

The present invention has been accomplished in view of the above mentioned circumstances of the prior art and it is thus an object of the present invention to provide a double tuning circuit of a TV tuner that is capable of selectively varying the frequency response thereof in accordance with a change in frequency response occurring in an intermediate-frequency signal output by the frequency-conversion unit.

In order to achieve the object described above, the present invention provides a double tuning circuit comprising a primary tuning circuit and a secondary tuning circuit coupled with each other wherein at least one of the primary and secondary tuning circuits comprises two series circuits connected to each other in parallel with each of the two series circuits including an impedance element and a switching diode, and a means for selectively turning on and off each of the switching diodes by using a switching voltage corresponding to a signal reception state.

In the means described above, a predetermined voltage is supplied to each of the switching diodes employed in the double tuning circuit for each reception channel and for the magnitude of each voltage of the automatic gain control of the reception channel. When the TV tuner receives a signal, the predetermined switching voltages for the reception channel of the signal and the magnitude of the voltage of the automatic gain control are supplied to the switching diodes in order to selectively connect the impedance elements of the series circuits each comprising a damping resistor or an additional resonance capacitor to the primary and/or secondary tuning circuits. As described above, the series circuit is connected in parallel to the primary and/or secondary tuning circuits. The selective parallel connection of the series circuit to the primary and/or secondary tuning circuits result in a frequency response of the double tuning circuit that cancels any change in frequency response occurring in the intermediate-frequency signal output by the frequency-conversion unit for any channel and the magnitude of any voltage of the automatic gain control in the channel. As a result, the intermediate-frequency signal obtained on the output side of the double tuning circuit always exhibits a frequency response close to the ideal one.

BRIEF DESCRIPTION OF THE DRAWINGS

FIGS. 2A to 2D are characteristic diagrams showing frequency responses of various portions of the double tuning circuit employed in a TV tuner shown in FIG. 1;

FIG. 3 is an explanatory diagram showing pieces of information stored in a control table of an integrated circuit of the double tuning circuit employed in a TV tuner shown in FIG. 1;

FIGS. 5A to 5E are characteristic diagrams showing frequency responses of various portions of the double tuning circuit employed in a TV tuner shown in FIG. 4;

FIG. 6 is an explanatory diagram showing pieces of information stored in a control table of an integrated circuit of the double tuning circuit employed in a TV tuner shown in FIG. 4;

FIGS. 8A to 8E are characteristic diagrams showing frequency responses of various portions of the double tuning circuit employed in a TV tuner shown in FIG. 7;

DESCRIPTION OF THE PREFERRED EMBODIMENTS

The present invention will become more apparent from the following detailed description of some preferred embodiments with reference to accompanying diagrams showing the embodiments.

Figure 1:
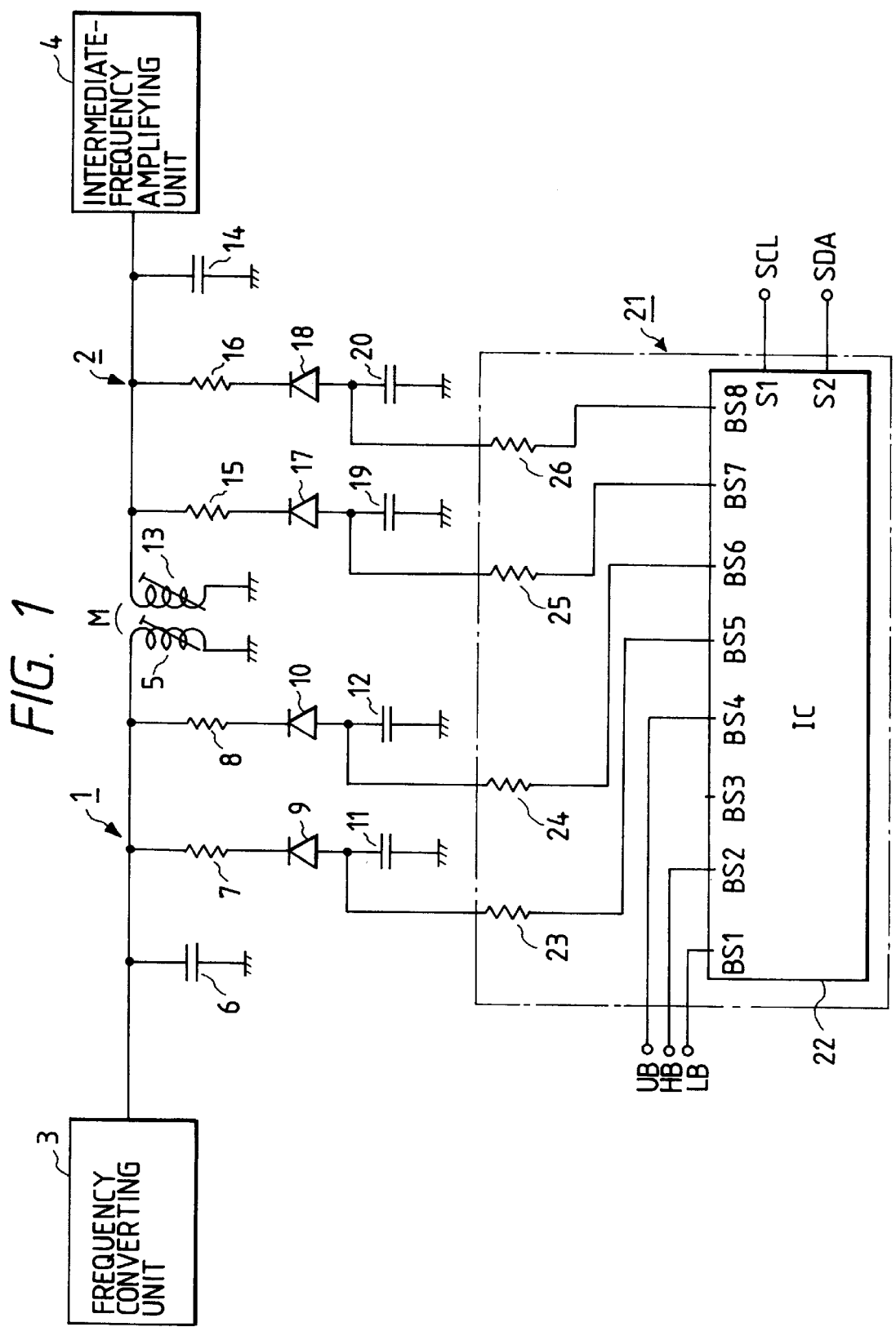
FIG. 1 is a diagram showing the circuit configuration of a double tuning circuit employed in a TV tuner as implemented by a first embodiment of the present invention.

FIG. 1 is a diagram showing the circuit configuration of a double tuning circuit of a TV tuner provided by the first embodiment of the present invention.

As shown in the figure, the double tuning circuit comprises a primary tuning circuit 1 and a secondary tuning circuit 2. The input terminal of the primary tuning circuit 1 is connected to the output terminal of a frequency-conversion unit 3 at the preceding stage whereas the output terminal of the secondary tuning circuit 2 is connected to the input terminal of an intermediate-frequency amplifier unit 4 at the succeeding stage. The primary tuning circuit 1 comprises a first adjustable inductor 5, a first resonance capacitor 6, a first damping resistor 7, a second damping resistor 8, a first switching diode 9, a second switching diode 10, a first bypass capacitor 11 and a second bypass capacitor 12. By the same token, the secondary tuning circuit 2 comprises a second adjustable inductor 13, a second resonance capacitor 14, a third damping resistor 15, a fourth damping resistor 16, a third switching diode 17, a fourth switching diode 18, a third bypass capacitor 19 and a fourth bypass capacitor 20. In addition, a control circuit unit 21 comprises an integrated circuit (IC) 22 forming a phase locked loop (PLL), a first buffer resistor 23, a second buffer resistor 24, a third buffer resistor 25 and a fourth buffer resistor 26.

To describe it in another way, the primary tuning circuit 1 comprises a first series circuit and a second series circuit connected to each other in parallel wherein the first series circuit comprises the first adjustable inductor 5 connected in parallel with the first resonance capacitor 6 connected in parallel with the series connections of the first damping resistor 7, the first switching diode 9 and the first bypass capacitor 11 whereas the second series circuit comprises the second damping resistor 8 connected in series with the second switching diode 10 and the second bypass capacitor 12. By the same token, the secondary tuning circuit 2 comprises a third series circuit and a fourth series circuit connected to each other in parallel wherein the third series circuit comprises second adjustable inductor 13 connected in parallel with the second resonance capacitor 14 connected in parallel with the series connections of the third damping resistor 15, the third switching diode 17 and the third bypass capacitor 19 whereas the fourth series circuit comprises the fourth damping resistor 16 connected in series with the fourth switching diode 18 and the fourth bypass capacitor 20. In addition, the first adjustable inductor 5 and the second adjustable inductor 13 are inductively coupled with each other to create a double tuning circuit.

The integrated circuit 22 has at least eight output ports BS1 to BS8 and two control ports S1 and S2. In addition, a control table, which is not shown in the figure, is included in the integrated circuit 22. The output port BS4 is connected to a UHF band select pin UB whereas the output ports BS2 and BS1 are connected to a VHF high band select pin HB and a VHF low band select pin LB respectively. The output port BS5 is connected to a junction point between the first switching diode 9 and the first bypass capacitor 11 by way of the first buffer resistor 23. Similarly, the output port BS6 is connected to a junction point between the second switching diode 10 and the second bypass capacitor 12 by way of the second buffer resistor 24. Likewise, output port BS7 is connected to a junction point between the third switching diode 17 and the third bypass capacitor 19 by way of the third buffer resistor 25. Similarly, output port BS8 is connected to a junction point between the fourth switching diode 18 and the fourth bypass capacitor 20 by way of the fourth buffer resistor 26. The control port S1 is connected to an SCL-signal supply pin SCL whereas the control port S2 is connected to an SDA-signal supply pin SDA. The signal on pin SCL is the operation clock signal for IC 22. The signal on pin SDA represents the channel of the signal received by the TV tuner, which includes channels of low or high VHF bands or channels of the UHF band. IC 22 determines output states of BS1 to BS8 in response to signals on pins SCL and SDA.

FIGS. 2A to 2D are diagrams showing frequency-response characteristics of elements in the double tuning circuit employed in the TV tuner shown in FIG. 1. FIG. 3 is an explanatory diagram showing pieces of information written in the control table in the integrated circuit 22.

A curve (a) shown in FIG. 2A is an all but ideal frequency response of intermediate-frequency signal output by a frequency mixing unit (or a frequency-conversion unit) 3. A curve (a) shown in FIG. 2B is a frequency response of an intermediate-frequency signal with a protrusion at the center of the pass band. Curves (a) shown in FIG. 2C are each a frequency response of an intermediate-frequency signal with a protrusion on the high-frequency side of the pass band. Curves (a) shown in FIG. 2D are each a frequency response of an intermediate-frequency signal with a protrusion on the low-frequency side of the pass band. As described above, the characteristic curves (a) shown in FIGS. 2A to 2D are each the frequency response of an intermediate-frequency signal output by the frequency mixing unit 3. On the other hand, characteristic curves (b) are each the frequency response of the double tuning circuit whereas characteristic curves (c) are each the frequency response of an intermediate-frequency signal output by the double tuning circuit.

By the way, a TV tuner has its double tuning circuit adjusted and the control table of its integrated circuit (IC) 22 filled with pieces of information at the factory in advance prior to shipping. For this reason, the adjustment of the double tuning circuit and a means for writing the information into the control table are first explained.

First of all, the first and second switching diodes 9 and 10 as well as the third and fourth switching diodes 17 and 18 employed in the double tuning circuit are put in a cut-off state. Then, while the inductance values of the first and second inductors 5 and 13 are being adjusted, the degree of coupling between the first and second inductors 5 and 13 is adjusted so that the primary tuning circuit 1 resonates at a frequency on the low-frequency side of the intermediate-frequency pass band, for example, at a frequency in close proximity to a point $f_1$ of the characteristic (b) shown in FIG. 2A and the secondary tuning circuit 2 resonates at a frequency on the high-frequency side of the intermediate-frequency pass band, for example, at a frequency in close proximity to a point $f_2$ of the characteristic (b) shown in FIG. 2A. As a result, the frequency response of an intermediate-frequency signal output by the double tuning circuit is set to be an all but ideal curve which is symmetrical with respect to a center frequency $f_0$ as shown by the characteristic (b) of FIG. 2A.

Then, pieces of on and off information classified into types 1 to 6 are written into the control table of the integrated circuit 22 as shown in FIG. 3. Each piece of information is associated with the characteristic curve (a) of FIGS. 2A to 2D representing the frequency response of an intermediate-frequency signal output by the frequency-conversion unit 3 for signals of all channels received by the TV tuner in operation in the VHF low band, the VHF high band or the UHF band at the high, medium or low electric-field intensity of the signals of the channels.

To put it in more detail, the pieces of information of type 1 shown in FIG. 3 are associated with a high electric-field intensity of a signal of a channel in the VHF high band received by the TV tuner or the characteristic curve (a) of FIG. 2A representing the frequency response of an intermediate-frequency signal output by the frequency-conversion unit 3. In this case, four pieces of off information for this channel and the high electric-field intensity to output signals from the output ports BS5 to BS8 respectively as off voltages are written into the row of type 1 of the control table. By the same token, the pieces of information of type 2 shown in FIG. 3 are associated with a medium electric-field intensity of a signal of the same channel in the VHF high band received by the TV tuner or the characteristic curve (a) of FIG. 2B representing the frequency response of an intermediate-frequency signal output by the frequency-conversion unit 3. In this case, four pieces of on information for this channel and the medium electric-field intensity to output signals from the output ports BS5 to BS8 respectively as on voltages are written into the row of type 2 of the control table. Similarly, the pieces of information of type 3 shown in FIG. 3 are associated with a low electric-field intensity of a signal of the same channel in the VHF high band received by the TV tuner or the solid-line characteristic curve (a) of FIG. 2C representing the frequency response of an intermediate-frequency signal output by the frequency-conversion unit 3. In this case, three pieces of off information for this channel and the low electric-field intensity to output signals from the output ports BS5, BS6 and BS8 respectively as off voltages and a piece of on information for this channel and the low electric-field intensity to output a signal from the output port BS7 as an on voltage are written into the row of type 3 of the control table.

Likewise, the pieces of information of type 4 shown in FIG. 3 are associated with a high electric-field intensity of a signal of another channel in the VHF high band received by the TV tuner or the dotted-line characteristic curve (a) of FIG. 2C representing the frequency response of an intermediate-frequency signal output by the frequency-conversion unit 3. In this case, two pieces of off information for this channel and the high electric-field intensity to output signals from the output ports BS5 and BS6 respectively as off voltages and two pieces of on information for this channel and the high electric-field intensity to output signals from the output ports BS7 and BS8 respectively as on voltages are written into the row of type 4 of the control table. By the same token, the pieces of information of type 5 shown in FIG. 3 are associated with a medium electric-field intensity of a signal of the same channel in the VHF high band received by the TV tuner or the solid-line characteristic curve (a) of FIG. 2D representing the frequency response of an intermediate-frequency signal output by the frequency-conversion unit 3. In this case, a piece of on information for this channel and the medium electric-field intensity to output a signal from the output port BS5 as anion voltage and three pieces of off information for this channel and the medium electric-field intensity to output signals from the output ports BS6 to BS8 as off voltages are written into the row of type 5 of the control table. Similarly, the pieces of information of type 6 shown in FIG. 3 are associated with a low electric-field intensity of a signal of the same channel in the VHF high band received by the TV tuner or the dotted-line characteristic curve (a) of FIG. 2D representing the frequency response of an intermediate-frequency signal output by the frequency-conversion unit 3. In this case, two pieces of on information for this channel and the low electric-field intensity to output signals from the output ports BS5 and BS6 as respectively off voltages and two pieces of on information for this channel and the low electric-field intensity to output signals from the output ports BS7 and BS8 as on voltages are written into the row of type 6 of the control table.

Then, the operations to write pieces of on and off information into the table are repeated in the same way for all channels of the VHF high and low bands and all channels of UHF band. To be more specific, a row of the control table of FIG. 3 associated with a type of the information is selected in accordance with a characteristic curve (a) shown in FIGS. 2A to 2D which is determined by the channel and the intensity of the electric field of a signal received by the TV tuner to represent the frequency response of the intermediate-frequency signal output by the frequency-conversion unit 3 and pieces of on and off information for the channel and the intensity of the electric field are written into areas on the selected row of the control table representing the type of the information, completing the initialization of the control table.

Next, the operation of the double tuning circuit shown in FIG. 1 is explained by referring to FIGS. 2A to 2D and FIG. 3.

Now, let the TV tuner receive a signal of a channel in the VHF high band with a high electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the characteristic curve (a) shown in FIG. 2A which is associated with the information of type 1 written in the control table, generating an off voltage (normally a zero or negative voltage) to each of the four output ports BS5 to BS8. The off voltages are applied to the first, second, third fourth switching diodes 9, 10, 17 and 18 by way of the first to fourth buffer resistors 23 to 26 respectively, turning off all the first, second, third and fourth switching diodes 9, 10, 17 and 18. As a result, the primary tuning circuit 1 is reduced to only a first resonance circuit comprising the first adjustable inductor 5 and the first resonance capacitor 6 whereas the secondary tuning circuit 2 is reduced to only a second resonance circuit comprising the second adjustable inductor 13 and the second resonance capacitor 14. With the primary and secondary tuning circuits 1 and 2 reduced as such, the frequency response of the double tuning circuit resembles the characteristic (b) shown in FIG. 2A and the frequency response of an intermediate-frequency signal obtained on the output side of the double tuning circuit is represented by the curve (c) shown in FIG. 2A, an all but flat characteristic in the pass band.

Next, let the electric-field intensity of the signal of the channel received by the TV tuner change to a medium value. In this case, from the combination of the channel of the signal and the intensity of the electric field, the integrated circuit 22 determines that the intermediate-frequency signal has a frequency response represented by the characteristic curve (a) shown in FIG. 2B which is associated with the information of type 2 written in the control table, generating an on voltage (normally a positive voltage) to each of the four output ports BS5 to BS8. The on voltages are applied to the first, second, third and fourth switching diodes 9, 10, 17 and 18 by way of the first to fourth buffer resistors 23 to 26 respectively, turning on all the first, second, third and fourth switching diodes 9, 10, 17 and 18. As a result, the primary tuning circuit 1 comprises the first resonance circuit composed of the first adjustable inductor 5 and the first resonance capacitor 6 and the first and second damping resistors 7 and 8 each inserted in parallel to the first resonance circuit, whereas the secondary tuning circuit 2 comprises the second resonance circuit composed of the second adjustable inductor 13 and the second resonance capacitor 14 and the third and fourth damping resistors 15 and 16 each inserted in parallel to the second resonance circuit. With the primary and secondary tuning circuits 1 and 2 built as such, the frequency response of the double tuning circuit resembles the characteristic (b) shown in FIG. 2B and the frequency response of an intermediate-frequency signal obtained on the output side of the double tuning circuit is represented by the curve (c) shown in FIG. 2B, an all but flat characteristic in the pass band.

This time, let the electric-field intensity of the signal of the channel received by the TV tuner decrease further to a small value. In this case, from the combination of the channel of the signal and the intensity of the electric field, the integrated circuit 22 determines that the intermediate-frequency signal has a frequency response represented by the solid-line characteristic curve (a) shown in FIG. 2C which is associated with the information of type 3 written in the control table, generating an off voltage to each of the three output ports BS5, BS6 and BS8 and an on voltage to the output port BS7. The off voltages are applied to the first, second and fourth switching diodes 9, 10 and 18 by way of the first, second and fourth buffer resistors 23, 24 and 26 respectively and the on voltage is applied to the third switching diode 17 by way of the third buffer resistor 25, turning off the first, second and fourth switching diodes 9, 10 and 18 but turning on the third switching diode 17. As a result, the primary tuning circuit 1 is reduced to only the first resonance circuit comprising the first adjustable inductor 5 and the first resonance capacitor 6, whereas the secondary tuning circuit 2 comprises the second resonance circuit composed of the second adjustable inductor 13 and the second resonance capacitor 14 and the third damping resistors 15 inserted in parallel to the second resonance circuit. With the primary and secondary tuning circuits 1 and 2 reduced and built respectively as such, the frequency response of the double tuning circuit resembles the solid-line characteristic (b) shown in FIG. 2C and the frequency response of an intermediate-frequency signal obtained on the output side of the double tuning circuit is represented by the curve (c) shown in FIG. 2C, an all but flat characteristic in the pass band.

Now, let the TV tuner receive a signal of another channel in the VHF high band with a high electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the dotted-line characteristic curve (a) shown in FIG. 2C which is associated with the information of type 4 written in the control table, generating an off voltage to each of the two output ports BS5 to BS6 and an on voltage to each of the two output ports BS7 to BS8. The off voltages are applied to the first and second switching diodes 9 and 10 by way of the first and second buffer resistors 23 and 24 respectively while the on voltages are applied to the third and fourth switching diodes 17 and 18 by way of the third and fourth buffer resistors 25 and 26 respectively, turning off the first and second switching diodes 9 and 10 but turning on the switching diodes 17 and 18. As a result, the primary tuning circuit 1 is reduced to only a resonance circuit comprising the first adjustable inductor 5 and the first resonance capacitor 6 whereas the secondary tuning circuit 2 comprises the resonance circuit composed of the second adjustable inductor 13 and the second resonance capacitor 14 and the third and fourth damping resistors 15 and 16 each inserted in parallel to the resonance circuit. With the primary and secondary tuning circuits 1 and 2 reduced and built respectively as such, the frequency response of the double tuning circuit resembles the dotted-line characteristic (b) shown in FIG. 2C and the frequency response of an intermediate-frequency signal obtained on the output side of the double tuning circuit is represented by the curve (c) shown in FIG. 2C, an all but flat characteristic in the pass band.

Next, let the electric-field intensity of the signal of the channel received by the TV tuner change to a medium value. In this case, from the combination of the channel of the signal and the intensity of the electric field, the integrated circuit 22 determines that the intermediate-frequency signal has a frequency response represented by the solid-line characteristic curve (a) shown in FIG. 2D which is associated with the information of type 5 written in the control table, generating an on voltage to the first output port BS5 and an off voltage to each of the output ports BS6 to BS8. The on voltage is applied to the first switching diode 9 by way of the first buffer resistor 23 while the off voltages are applied to the second, third and fourth switching diodes 10, 17 and 18 by way of the second to fourth buffer resistors 24 to 26 respectively, turning on the first switching diode 9 and turning off the second, third and fourth switching diodes 10, 17 and 18. As a result, the primary tuning circuit 1 comprises the first resonance circuit composed of the first adjustable inductor 5 and the first resonance capacitor 6 and the first damping resistor 7 inserted in parallel to the first resonance circuit, whereas the secondary tuning circuit 2 is reduced to only the second resonance circuit composed of the second adjustable inductor 13 and the second resonance capacitor 14. With the primary and secondary tuning circuits 1 and 2 built and reduced respectively as such, the frequency response of the double tuning circuit resembles the solid-line characteristic (b) shown in FIG. 2D and the frequency response of an intermediate-frequency signal obtained on the output side of the double tuning circuit is represented by the curve (c) shown in FIG. 2D, an all but flat characteristic in the pass band.

This time, let the electric-field intensity of the signal of the channel received by the TV tuner decrease further to a small value. In this case, from the combination of the channel of the signal and the intensity of the electric field, the integrated circuit 22 determines that the intermediate-frequency signal has a frequency response represented by the dotted-line characteristic curve (a) shown in FIG. 2D which is associated with the information of type 6 written in the control table, generating an on voltage to each of the two output ports BS5 and BS6 and an off voltage to each of the output ports BS7 and BS8. The on voltages are applied to the first and second switching diodes 9 and 10 by way of the first and second buffer resistors 23 and 24 while the off voltages are applied to the third and fourth switching diodes 17 and 18 by way of the third and fourth buffer resistors 25 and 26 respectively, turning on the first and second switching diodes 9 and 10 but turning of the third and fourth switching diodes 17 and 18. As a result, the primary tuning circuit 1 comprises the first resonance circuit comprising the first adjustable inductor 5 and the first resonance capacitor 6 and the first and second damping resistors 7 and 8 each inserted in parallel to the first tuning circuit, whereas the secondary tuning circuit 2 is reduced to only the second resonance circuit comprising the second adjustable inductor 13 and the second resonance capacitor 14. With the primary and secondary tuning circuits 1 and 2 built and reduced respectively as such, the frequency response of the double tuning circuit resembles the dotted-line characteristic (b) shown in FIG. 2D and the frequency response of an intermediate-frequency signal obtained on the output side of the double tuning circuit is represented by the curve (c) shown in FIG. 2D, an all but flat characteristic in the pass band.

As described above, pieces of on and off information have been written in advance into the table for combinations of all other channels of the VHF high band, all channels of the VHF low band and all channels of the UHF band and the intensities of the electric field of the received signal. To be more specific, a row of the control table of FIG. 3 associated with a type of the information is selected in accordance with the characteristic curve (a) shown in FIGS. 2A to 2D which is determined by the channel and the intensity of the electric field of a signal received by the TV tuner to represent the frequency response of the intermediate-frequency signal output by the frequency-conversion unit 3 and pieces of on and off information for the channel and the intensity of the electric field are written into areas on the selected row of the control table representing one of types 1 to 6 of the information. As a result, from the combination of the channel of the received signal and the intensity of the electric field of the received signal, the integrated circuit 22 can select one of types 1 to 6 of information stored in the control table shown in FIG. 3, generating on and off voltages associated with the selected type to output ports BS5 to BS8 in order to selectively insert and connect the first, second, third and fourth damping resistors 7, 8, 15 and 16 in parallel to the primary and secondary tuning circuits 1 and 2. It is thus possible to obtain an intermediate-frequency signal obtained on the output side of the double tuning circuit with a frequency response represented by the curve (c) shown in FIG. 2A, 2B, 2C or 2D, an all but flat characteristic in the pass band, without regard to the frequency-response characteristic of the intermediate-frequency signal output by the frequency-conversion unit 3.

As described above, according to the present embodiment, the first, second, third and fourth damping resistors 7, 8, 15 and 16 are selectively inserted and connected to the double tuning circuit in order to correct the frequency response thereof into a frequency response close to an ideal one. As a result, it is possible to obtain an intermediate-frequency signal obtained on the output side of the double tuning circuit with a frequency response represented by an all but flat characteristic in the pass band, without regard to the frequency-response characteristic of the intermediate-frequency signal output by the frequency-conversion unit 3 which may change from receiving channel to receiving channel or change with the intensity of the electric field dependently on characteristics of components composing the TV tuner.

Figure 4:
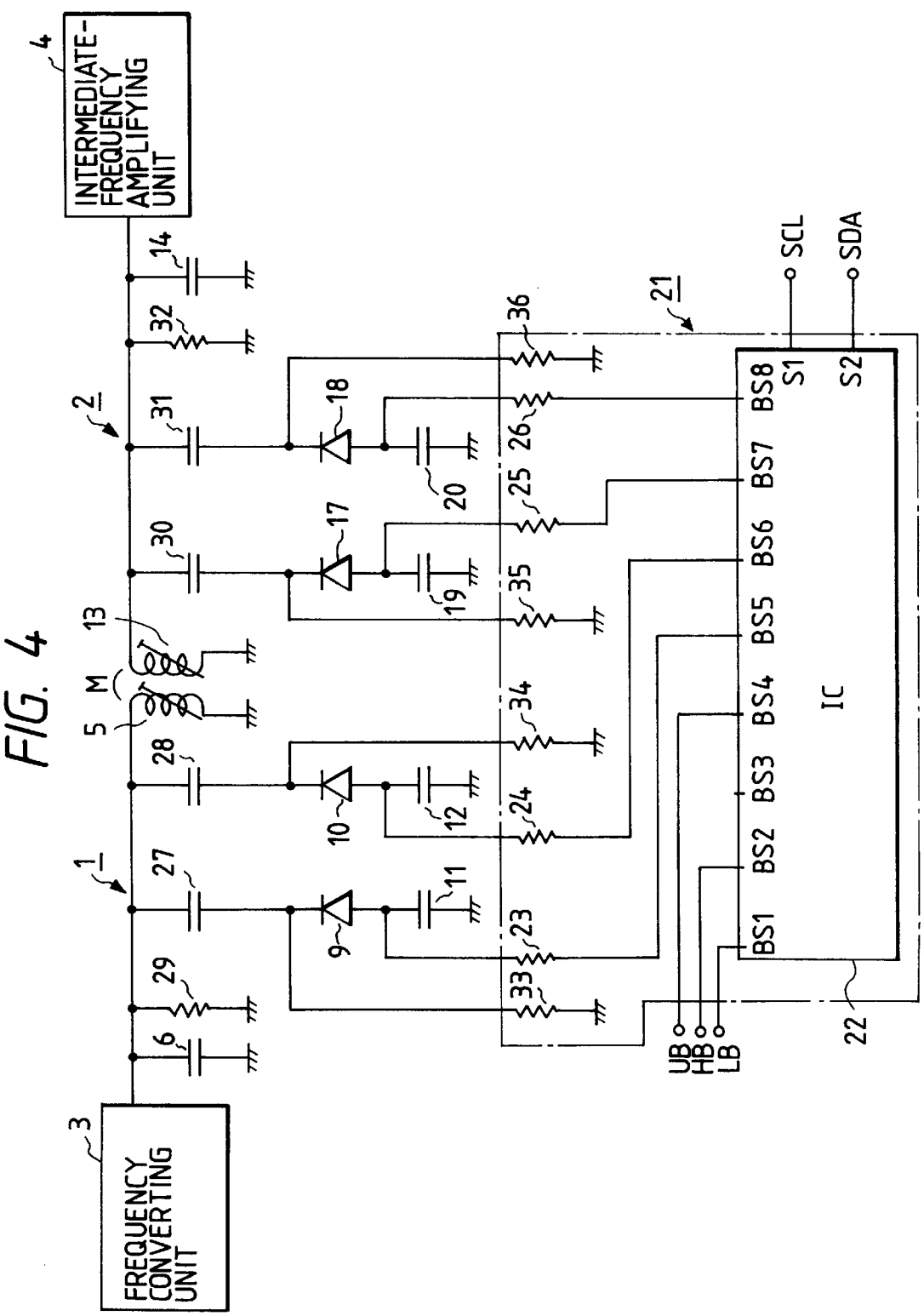
FIG. 4 is a diagram showing the circuit configuration of a double tuning circuit employed in a TV tuner as implemented by a second embodiment of the present invention.

FIG. 4 is a diagram showing a circuit configuration of a double tuning circuit employed in a TV tuner as implemented by a second embodiment of the present invention.

Components shown in FIG. 4 which are identical with those shown in FIG. 1 are denoted by the same reference numerals used in FIG. 1.

As shown in FIG. 4, a primary tuning circuit 1 comprises a first resonance circuit composed of a first adjustable inductor 5 connected in parallel with a first resonance capacitor 6 connected in parallel with a first additional capacitor 27 connected in series to a first switching diode 9 connected in parallel with a second additional capacitor 28 connected in series to a second switching diode 10 and connected in parallel with a first fixed damping resistor 29. By the same token, a secondary tuning circuit 2 comprises a second resonance circuit composed of a second adjustable inductor 13 connected in parallel with a second resonance capacitor 14 connected in parallel with a third additional capacitor 30 connected in series to a third switching diode 17 connected in parallel with a fourth additional capacitor 31 connected in series to a fourth switching diode 18 connected in parallel with a second fixed damping resistor 32. A control circuit unit 21 comprises first to fourth buffer resistors 23 to 26 and fifth to eighth buffer resistors 33 to 36 provided between the ground and the anodes of the first, second, third and fourth switching diodes 9, 10, 17 and 18 respectively. The fifth to eighth buffer resistors 33 to 36 serve as feedback paths of on voltages applied to the first, second, third and fourth switching diodes 9, 10, 17 and 18 respectively.

The second embodiment shown in FIG. 4 (which is referred to hereafter simply as the former embodiment) is different in configuration from the first embodiment shown in FIG. 1 (which is referred to hereafter simply as the latter embodiment) in that the former embodiment comprises the first to fourth additional capacitors 27 to 30 which can be selectively inserted and connected to the double tuning circuit while the latter embodiment comprises the first, second, third and fourth damping resistors 7, 8, 15 and 16 which can be selectively inserted and connected to the double tuning circuit. In addition, the former embodiment comprises the first and second fixed damping resistors 29 and 32 while the latter embodiment does not have any fixed damping resistors. Moreover, the former embodiment has the fifth to eighth buffer resistors 33 to 36 which serve as feedback paths of on voltages applied to the first, second, third and fourth switching diodes 9, 10, 17 and 18 respectively while the latter embodiments does not have the fifth to eighth buffer resistors 33 to 36. The rest of the configuration of the former configuration is the same as that of the latter configuration. For this reason, explanation of the rest of the configuration of the former embodiment is omitted.

FIGS. 5A to 5E are diagrams showing frequency-response characteristics of components composing the double tuning circuit employed in the TV tuner shown in FIG. 4. FIG. 6 is an explanatory diagram showing pieces of information written into a control table in an integrated circuit 22.

A curve (a) shown in FIG. 5A is an all but ideal frequency response of an intermediate-frequency signal output by a frequency mixing unit. Curves (a) shown in FIG. 5B are frequency responses of the intermediate-frequency signals shifted to the low-frequency and high-frequency sides of the pass band. Curves (a) shown in FIG. 5C are frequency responses of the intermediate-frequency signals with protrusions on the low-frequency and high-frequency sides of the pass band. A curve (a) shown in FIG. 5D is a frequency response of the intermediate-frequency signal spread to both the low-frequency and high-frequency sides of the pass band. A curve (a) shown in FIG. 5E is a frequency response of the intermediate-frequency signal narrowed on both the low-frequency and high-frequency sides of the pass band. As described above, the characteristic curves (a) shown in FIGS. 5A to 5E are each the frequency response of an intermediate-frequency signal output by the frequency mixing unit 3. On the other hand, characteristic curves (b) are each the frequency response of the double tuning circuit whereas characteristic curves (c) are each the frequency response of an intermediate-frequency signal output by the double tuning circuit.

In addition, also in the case of this embodiment, a TV tuner has its double tuning circuit adjusted and the control table of its integrated circuit (IC) 22 filled with pieces of information in advance at the factory prior to shipping.

To put it in detail, in this double tuning circuit, with the first and third switching diodes 9 and 17 turned on and with the second and fourth switching diodes 10 and 18 turned off, the degree of coupling between the first and second adjustable inductors 5 and 13 is adjusted by adjusting the inductance values of the first and second adjustable inductors 5 and 13, so that the primary tuning circuit 1 resonates at a frequency on the low-frequency side of the intermediate-frequency pass band, for example, at a frequency in close proximity to a point $f_1$ of the characteristic (b) shown in FIG. 5A and the secondary tuning circuit 2 resonates at a frequency on the high-frequency side of the intermediate-frequency pass band, for example, at a frequency in close proximity to a point $f_2$ of the characteristic (b) shown in FIG. 5A. As a result, the frequency response of an intermediate-frequency signal output by the double tuning circuit is set to be an all but ideal curve which is symmetrical with respect to a center frequency $f_0$ as shown by the characteristic (b) of FIG. 5A.

Then, pieces of on and off information classified into types 1 to 7 are written into the control table of the integrated circuit 22 as shown in FIG. 6. Each piece of information is associated with the characteristic curve (a) of FIGS. 5A to 5D or 5E representing the frequency response of an intermediate-frequency signal output by the frequency-conversion unit 3 for signals of all channels received by the TV tuner in operation in the VHF low band, the VHF high band or the UHF band at the high, medium or low electric-field intensity of the signals of the channels.

The operation of the double tuning circuit shown in FIG. 4 is explained by referring to FIGS. 5A to 5E and FIG. 6.

Now, let the TV tuner receive a signal of a first channel in the VHF high band, the VHF low band or the UHF band with a high electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the characteristic curve (a) shown in FIG. 5A which is associated with the information of type 1 written in the control table, generating an on voltage to each of the two output ports BS5 and BS7 and an off voltage to each of the two output ports BS6 and BS8. The on voltages are applied to the first and third switching diodes 9 and 17 by way of the first and third buffer resistors 23 and 25 respectively while the off voltages are applied to the second and fourth switching diodes 10 and 18 by way of the second and fourth buffer resistors 24 and 26 respectively, turning on the first and third switching diodes 9 and 17 but turning off the second and fourth switching diodes 10 and 18. As a result, the primary tuning circuit 1 is reduced to a first resonance circuit comprising only the first adjustable inductor 5, the first resonance capacitor 6 and the first additional capacitor 27 whereas the secondary tuning circuit 2 is reduced to a second resonance circuit comprising only the second adjustable inductor 13, the second resonance capacitor 14 and the third additional capacitor 30. With the primary and secondary tuning circuits 1 and 2 reduced as such, the frequency response of the double tuning circuit resembles the characteristic (b) shown in FIG. 5A and the frequency response of an intermediate-frequency signal obtained on the output side of the double tuning circuit is represented by the curve (c) shown in FIG. 5A, an all but flat characteristic in the pass band.

Now, let the TV tuner receive a signal of a second channel in the VHF high band, the VHF low band or the VHF low band with a medium electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the solid-line characteristic curve (a) shown in FIG. 5B which is associated with the information of type 2 written in the control table, generating an on voltage to the output port BS5 and an off voltage to each of the three output ports BS6, BS7 and BS8. The on voltage is applied to the first switching diode 9 by way of the first buffer resistor 23 while the off voltages are applied to the second, third and fourth switching diodes 10, 17 and 18 by way of the second, third and fourth buffer resistors 24, 25 and 26 respectively, turning on the first switching diode 9 but turning off the second, third and fourth switching diodes 10, 17 and 18. As a result, the primary tuning circuit 1 is reduced to a first resonance circuit comprising only the first adjustable inductor 5, the first resonance capacitor 6 and the first additional capacitor 27 whereas the secondary tuning circuit 2 is reduced to a second resonance circuit comprising only the second adjustable inductor 13 and the second resonance capacitor 14. With the primary and secondary tuning circuits 1 and 2 reduced as such, the frequency response of the double tuning circuit resembles the solid-line characteristic (b) shown in FIG. 5B and the frequency response of an intermediate-frequency signal obtained on the output side of the double tuning circuit is represented by the curve (c) shown in FIG. 5B, an all but flat characteristic in the pass band.

Now, let the TV tuner receive a signal of a third channel in the VHF high band, the VHF low band or the VHF low band with a low electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the dotted-line characteristic curve (a) shown in FIG. 5B which is associated with the information of type 3 written in the control table, generating an on voltage to the output port BS7 and an off voltage to each of the three output ports BS5, BS6 and BS8. The on voltage is applied to the third switching diode 17 by way of the third buffer resistor 25 while the off voltages are applied to the first, second and fourth switching diodes 9, 10 and 18 by way of the first, second and fourth buffer resistors 23, 24 and 26 respectively, turning on the third switching diode 17 but turning off the first, second and fourth switching diodes 9, 10 and 18. As a result, the primary tuning circuit 1 is reduced to a first resonance circuit comprising only the first adjustable inductor 5 and the first resonance capacitor 6 whereas the secondary tuning circuit 2 is reduced to a second resonance circuit comprising only the second adjustable inductor 13, the second resonance capacitor 14 and the third additional capacitor 30. With the primary and secondary tuning circuits 1 and 2 reduced as such, the frequency response of the double tuning circuit resembles the dotted-line characteristic (b) shown in FIG. 5B and the frequency response of an intermediate-frequency signal obtained on the output side of the double tuning circuit is represented by the curve (c) shown in FIG. 5B, an all but flat characteristic in the pass band.

Now, let the TV tuner receive a signal of a fourth channel in the VHF high band, the VHF low band or the VHF low band with a high electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the solid-line characteristic curve (a) shown in FIG. 5C which is associated with the information of type 4 written in the control table, generating an on voltage to each of the four output ports BS5, BS6, BS7 and BS8. The on voltages are applied to the first, second, third and fourth switching diodes 9, 10, 17 and 18 by way of the first, second, third and fourth buffer resistors 23, 24, 25 and 26 respectively, turning on all the first, second, third and fourth switching diodes 9, 10, 17 and 18. As a result, the primary tuning circuit 1 is built into a first resonance circuit comprising the first adjustable inductor 5, the first resonance capacitor 6, the first additional capacitor 27 and the second additional capacitor 28 whereas the secondary tuning circuit 2 is built into to a second resonance circuit comprising the second adjustable inductor 13, the second resonance capacitor 14, the third additional capacitor 30 and the fourth additional capacitor 31. With the primary and secondary tuning circuits 1 and 2 built as such, the frequency response of the double tuning circuit resembles the solid-line characteristic (b) shown in FIG. 5C and the frequency response of an intermediate-frequency signal obtained on the output side of the double tuning circuit is represented by the curve (c) shown in FIG. 5C, an all but flat characteristic in the pass band.

Now, let the TV tuner receive a signal of a fifth channel in the VHF high band, the VHF low band or the VHF low band with a medium electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the dotted-line characteristic curve (a) shown in FIG. 5C which is associated with the information of type 5 written in the control table, generating an off voltage to each of the four output ports BS5, BS6, BS7 and BS8. The off voltages are applied to the first, second, third and fourth switching diodes 9, 10, 17 and 18 by way of the first, second, third and fourth buffer resistors 23, 24, 25 and 26 respectively turning off all the first, second, third and fourth switching diodes 9, 10, 17 and 18. As a result the primary tuning circuit 1 is reduced to a first resonance circuit comprising only the first adjustable inductor 5 and the first resonance capacitor 6 whereas the secondary tuning circuit 2 is reduced to a second resonance circuit comprising only the second adjustable inductor 13 and the second resonance capacitor 14. With the primary and secondary tuning circuits 1 and 2 reduced as such, the frequency response of the double tuning circuit resembles the dotted-line characteristic (b) shown in FIG. 5C and the frequency response of an intermediate-frequency signal obtained on the output side of the double tuning circuit is represented by the curve (c) shown in FIG. 5C, an all but flat characteristic in the pass band.

Now, let the TV tuner receive a signal of a sixth channel in the VHF high band, the VHF low band or the VHF low band with a low electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the characteristic curve (a) shown in FIG. 5D which is associated with the information of type 6 written in the control table, generating an off voltage to each of the two output ports BS5 and BS6 but an on voltage to each the two output ports BS7 and BS8. The off voltages are applied to the first and second switching diodes 9 and 10 by way of the first and second buffer resistors 23 and 24 respectively while the on voltages are applied to the third and fourth switching voltages 17 and 18 by way of the third and fourth buffer resistors 25 and 26 respectively, turning off the first and second switching diodes 9 and 10 but turning on the switching diodes 17 and 18. As a result, the primary tuning circuit 1 is reduced to a first resonance circuit comprising only the first adjustable inductor 5 and the first resonance capacitor 6 whereas the secondary tuning circuit 2 is built into a second resonance circuit comprising the second adjustable inductor 13, the second resonance capacitor 14, the third additional capacitor 30 and the fourth additional capacitor 31. With the primary and secondary tuning circuits 1 and 2 reduced and built respectively as such, the frequency response of the double tuning circuit resembles the characteristic (b) shown in FIG.

5D and the frequency response of an intermediate-frequency signal obtained on the output side of the double tuning circuit is represented by the curve (c) shown in FIG. 5D, an all but flat characteristic in the pass band.

Now, let the TV tuner receive a signal of a seventh channel in the VHF high band, the VHF low band or the VHF low band with a medium electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the characteristic curve (a) shown in FIG. 5E which is associated with the information of type 7 written in the control table, generating an on voltage to each of the two output ports BS5 and BS6 but an off voltage to each the two output ports BS7 and BS8. The on voltages are applied to the first and second switching diodes 9 and 10 by way of the first and second buffer resistors 23 and 24 respectively while the off voltages are applied to the third and fourth switching voltages 17 and 18 by way of the third and fourth buffer resistors 25 and 26 respectively, turning on the first and second switching diodes 9 and 10 but turning off the switching diodes 17 and 18. As a result, the primary tuning circuit 1 is built into a first resonance circuit comprising the first adjustable inductor 5, the first resonance capacitor 6, the first additional capacitor 27 and the second additional capacitor 28 whereas the secondary tuning circuit 2 is reduced to a second resonance circuit comprising only the second adjustable inductor 13 and the second resonance capacitor 14. With the primary and secondary tuning circuits 1 and 2 built and reduced respectively as such, the frequency response of the double tuning circuit resembles the characteristic (b) shown in FIG. 5E and the frequency response of an intermediate-frequency signal obtained on the output side of the double tuning circuit is represented by the curve (c) shown in FIG. 5E, an all but flat characteristic in the pass band.

As described above, pieces of on and off information have been written in advance into the table for combinations of all other channels of the VHF high band, all channels of the VHF low band and all channels of the UHF band and the intensities of the electric field of the received signal. To be more specific, a row of the control table of FIG. 6 associated with a type of the information is selected in accordance with the characteristic curve (a) shown in FIGS. 5A to 5E which is determined by the channel and the intensity of the electric field of a signal received by the TV tuner to represent the frequency response of the intermediate-frequency signal output by the frequency-conversion unit 3 and pieces of on and off information for the channel and the intensity of the electric field are written into areas on the selected row of the control table representing one of types 1 to 7 of the information. As a result, from the combination of the channel of the received signal and the intensity of the electric field of the received signal, the integrated circuit 22 can select one of types 1 to 7 of information stored in the control table shown in FIG. 6, generating on and off voltages associated with the selected type to output ports BS5 to BS8 in order to selectively insert and connect the first, second, third and fourth additional capacitors 27, 28, 30 and 31 in parallel to the primary and secondary tuning circuits 1 and 2. It is thus possible to obtain an intermediate-frequency signal obtained on the output side of the double tuning circuit with a frequency response represented by the curve (c) shown in FIG. 5A, 5B, 5C, 5D or 5E, an all but flat characteristic in the pass band, without regard to the frequency-response characteristic of the intermediate-frequency signal output by the frequency-conversion unit 3.

As described above, according to the present embodiment, the first, second, third and fourth additional capacitors 27, 28, 30 and 31 are selectively inserted and connected to the double tuning circuit in order to correct the frequency response thereof into a frequency response close to an ideal one. As a result, it is possible to obtain an intermediate-frequency signal obtained on the output side of the double tuning circuit with a frequency response represented by an all but flat characteristic in the pass band, without regard to the frequency-response characteristic of the intermediate-frequency signal output by the frequency-conversion unit 3 which may change from receiving channel to receiving channel or change with the intensity of the electric field dependently on characteristics of components composing the TV tuner.

Figure 7:
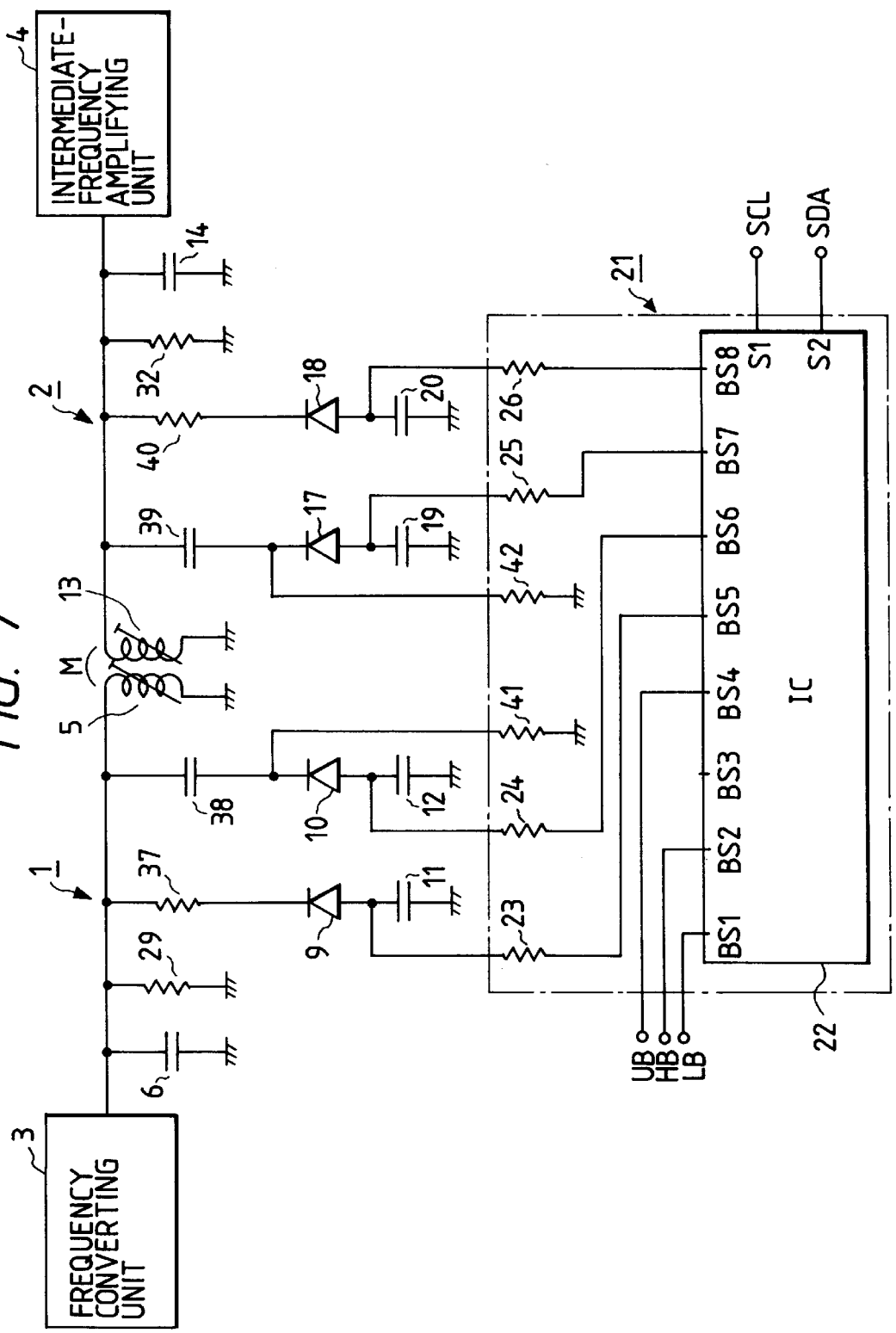
FIG. 7 is a diagram showing the circuit configuration of a double tuning circuit employed in a TV tuner as implemented by a third embodiment of the present invention.

FIG. 7 is a diagram showing a circuit configuration of a double tuning circuit employed in a TV tuner as implemented by a third embodiment of the present invention.

Compounds shown in FIG. 7 which are identical with those shown in FIG. 4 are denoted by the same reference numerals used in FIG. 4.

As shown in FIG. 7, a primary tuning circuit 1 comprises a first resonance circuit composed of a first adjustable inductor 5 connected in parallel with a first resonance capacitor 6 and a first damping resistor 29, connected in parallel with the combination of a fifth damping resistor 37 connected in series to a first switching diode 9 and connected in parallel with the combination of a fifth additional capacitor 38 connected in series to a second switching diode 10. By the same token, a secondary tuning circuit 2 comprises a second resonance circuit composed of a second adjustable inductor 13 connected in parallel with a second resonance capacitor 14 and a second fixed damping resistor 32 connected in parallel with the combination of a sixth additional capacitor 39 connected in series to a third switching diode 17 and connected in parallel with a combination of a sixth damping resistor capacitor 40 connected in series to a fourth switching diode 18. A control circuit unit 21 comprises first to fourth buffer resistors 23 to 26 and ninth to tenth buffer resistors 41 to 42 provided between the ground and the anodes of the second and third switching diodes 10 and 17 respectively. The ninth and tenth buffer resistors 41 to 42 serve as feedback paths of on voltages applied to the second and third switching diodes 10 and 17 respectively.

The second embodiment shown in FIG. 7 (which is referred to hereafter simply as the former embodiment) is different in configuration from the first embodiment shown in FIG. 4 (which is referred to hereafter simply as the latter embodiment) in that-the former embodiment comprises the fifth and sixth additional capacitors 38 and 39 and the fifth and sixth damping resistors 37 and 40 which can be selectively inserted and connected to the double tuning circuit while the latter embodiment comprises the first, second, third and fourth additional capacitors 27, 28, 30 and 31 which can be selectively inserted and connected to the double tuning circuit. In addition, the former embodiment comprises the ninth and tenth buffer resistors 41 and 42 which serve as feedback paths of on voltages applied to the second and third switching diodes 10 and 17 respectively while the latter embodiment has the fifth to eighth buffer resistors 33 to 36 which serve as feedback paths of on voltages applied to the first, second, third and fourth switching diodes 9, 10, 17 and 18 respectively. The rest of the configuration of the former configuration is the same as that of the latter configuration. For this reason, explanation of the rest of the configuration of the former embodiment is omitted.

Figures 9, 10:
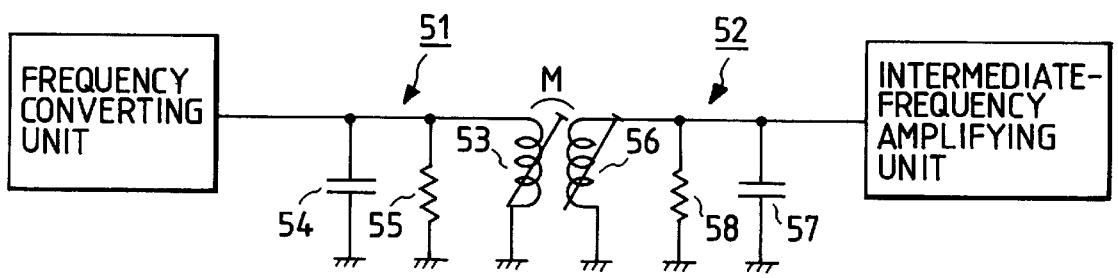
FIG. 9 is an explanatory diagram showing pieces of information stored in a control table of an integrated circuit of the double tuning circuit employed in a TV tuner shown in FIG. 7.
FIG. 10 is a diagram showing a typical circuit configuration of a conventional double tuning circuit employed in a commonly known TV tuner.
Figure 11:
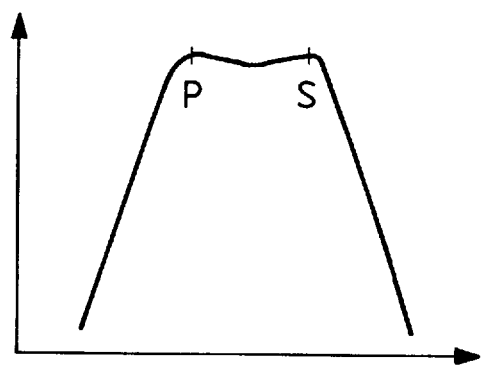
FIG. 11 is a characteristic diagram showing an ideal frequency response of an intermediate-frequency signal obtained on the output side of a double tuning circuit.

FIGS. 8A to 8D are diagrams showing frequency-response characteristics of components composing the double tuning circuit employed in the TV tuner shown in FIG. 7. FIG. 9 is an explanatory diagram showing pieces of information written into a control table in an integrated circuit 22.

A curve (a) shown in FIG. 8A is an all but ideal frequency response of an intermediate-frequency signal output by a frequency mixing unit (or frequency-conversion unit) 3. A curve (a) shown in FIG. 8B is a frequency response of the intermediate-frequency signal having a protrusion on the high-frequency side of the pass band. A curve (a) shown in FIG. 8C is a frequency response of the intermediate-frequency signal with a protrusion on the low-frequency side of the pass band. A curve (a) shown in FIG. 8D is a frequency response of the intermediate-frequency signal spread to both the low-frequency and high-frequency sides of the pass band. A curve (a) shown in FIG. 8E is a frequency response of the intermediate-frequency signal narrowed on both the low-frequency and high-frequency sides of the pass band. As described above, the characteristic curves (a) shown in FIGS. 8A to 8E are each the frequency response of an intermediate-frequency signal output by the frequency mixing unit 3. On the other hand, characteristic curves (b) are each the frequency response of the double tuning circuit whereas characteristic curves (c) are each the frequency response of an intermediate-frequency signal output by the double tuning circuit.

In addition, also in the case of this embodiment, a TV tuner has its double tuning circuit adjusted and the control table of its integrated circuit (IC) 22 filled with pieces of information in advance at the factory prior to shipping.

To put it in detail, in this double tuning circuit, with the second and third switching diodes 10 and 17 turned on and with the first and fourth switching diodes 9 and 18 turned off, the degree of coupling between the first and second adjustable inductors 5 and 13 is adjusted by adjusting the inductance values of the first and second adjustable inductors 5 and 13, so that the primary tuning circuit 1 resonates at a frequency on the low-frequency side of the intermediate-frequency pass band, for example, at a frequency in close proximity to a point $f_1$ of the characteristic (b) shown in FIG. 8A and the secondary tuning circuit 2 resonates at a frequency on the high-frequency side of the intermediate-frequency pass band, for example, at a frequency in close proximity to a point $f_2$ of the characteristic (b) shown in FIG. 8A. As a result, the frequency response of an intermediate-frequency signal output by the double tuning circuit is set to be an all but ideal curve which is symmetrical with respect to a center frequency $f_0$ as shown by the characteristic (b) of FIG. 8A.

Then, pieces of on and off information classified into types 1 to 5 are written into the control table of the integrated circuit 22 as shown in FIG. 9. Each piece of information is associated with the characteristic curve (a) of FIG. 8A, 8B, 8C, 8D or 8E representing the frequency response of an intermediate-frequency signal output by the frequency-conversion unit 3 for signals of all channels received by the TV tuner in operation in the VHF low band, the VHF high band or the UHF band at the high, medium or low electric-field intensity of the signals of the channels.

The operation of the double tuning circuit shown in FIG. 7 is explained by referring to FIGS. 8A to 8E and FIG. 9.

Now, let the TV tuner receive a signal of a first channel in the VHF high band, the VHF low band or the VHF band with a high electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the characteristic curve (a) shown in FIG. 8A which is associated with the information of type 1 written in the control table, generating an on voltage to each of the two output ports BS6 and BS7 and an off voltage to each of the two output ports BS5 and BS8. The on voltages are applied to the second and third switching diodes 10 and 17 by way of the second and third buffer resistors 24 and 25 respectively while the off voltages are applied to the first and fourth switching diodes 9 and 18 by way of the first and fourth buffer resistors 24 and 26 respectively, turning on the second and third switching diodes 10 and 17 but turning off the first and fourth switching diodes 9 and 18. As a result, the primary tuning circuit 1 is reduced to a first resonance circuit comprising only the first adjustable inductor 5, the first resonance capacitor 6, the first fixed damping resistor 29 and the fifth additional capacitor 38 whereas the secondary tuning circuit 2 is reduced to a second resonance circuit comprising only the second adjustable inductor 13, the second resonance capacitor 14, the second fixed damping resistor 32 and the sixth additional capacitor 39. With the primary and secondary tuning circuits 1 and 2 reduced as such, the frequency response of the double tuning circuit resembles the characteristic (b) shown in FIG. 8A and the frequency response of an intermediate-frequency signal obtained on the output side of the double tuning circuit is represented by the curve (c) shown in FIG. 8A, an all but flat characteristic in the pass band.

Now, let the TV tuner receive a signal of a second channel in the VHF high band, the VHF low band or the VHF low band with a medium electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the characteristic curve (a) shown in FIG. 8B which is associated with the information of type 2 written in the control table, generating an on voltage to the output port BS7 and an off voltage to each of the three output ports BS5, BS6 and BS8. The on voltage is applied to the third switching diode 17 by way of the third buffer resistor 25 while the off voltages are applied to the first, second and fourth switching diodes 9, 10 and 18 by way of the first, second and fourth buffer resistors 23, 24 and 26 respectively, turning on the third switching diode 17 but turning off the first, second and fourth switching diodes 9, 10 and 18. As a result, the primary tuning circuit 1 is reduced to a first resonance circuit comprising only the first adjustable inductor 5, the first resonance capacitor 6 and the first fixed damping resistor 29 whereas the secondary tuning circuit 2 is reduced to a second resonance circuit comprising only the second adjustable inductor 13, the second resonance capacitor 14 the second fixed damping resistor 32 and the sixth additional capacitor 39. With the primary and secondary tuning circuits 1 and 2 reduced as such, the frequency response of the double tuning circuit resembles the characteristic (b) shown in FIG. 8B and the frequency response of an intermediate-frequency signal obtained on the output side of the double tuning circuit is represented by the curve (c) shown in FIG. 8B, an all but flat characteristic in the pass band.

Now, let the TV tuner receive a signal of a third channel in the VHF high band, the VHF low band or the VHF low band with a low electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the characteristic curve (a) shown in FIG. 8C which is associated with the information of type 3 written in the control table, generating an on voltage to each of the two output ports BS5 and BS6 and an off voltage to each of the two output ports BS7 and BS8. The on voltages are applied to the first and second switching diodes 9 and 10 by way of the first and second buffer resistors 23 and 24 respectively while the off voltages are applied to the third and fourth switching diodes 17 and 18 by way of the third and fourth buffer resistors 25 and 26 respectively, turning on the first and second switching diodes 9 and 10 but turning off the third and fourth switching diodes 17 and 18. As a result, the primary tuning circuit 1 is built into a first resonance circuit comprising the first adjustable inductor 5, the first resonance circuit 6, the first fixed damping resistor 29, the fifth damping resistor 37 and the fifth additional capacitor 38 whereas the secondary tuning circuit 2 is reduced to a second resonance circuit comprising only the second adjustable inductor 13, the second resonance capacitor 14 and the second fixed damping resistor 32. With the primary and secondary tuning circuits 1 and 2 built and reduced respectively as such, the frequency response of the double tuning circuit resembles the characteristic (b) shown in FIG. 8C and the frequency response of an intermediate-frequency signal obtained on the output side of the double tuning circuit is represented by the curve (c) shown in FIG. 8C, an all but flat characteristic in the pass band.

Now, let the TV tuner receive a signal of a fourth channel in the VHF high band, the VHF low band or the VHF low band with a high electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the characteristic curve (a) shown in FIG. 8D which is associated with the information of type 4 written in the control table, generating an on voltage to the output port BS5 and an off voltage to each of the three output ports BS6, BS7 and BS8. The on voltage is applied to the first switching diode 9 by way of the first buffer resistor 23 while the off voltages are applied to the second, third and fourth switching diodes 10, 17 and 18 by way of the second, third and fourth buffer resistors 24, 25 and 26 respectively, turning on the first switching diode 9 but turning off the second, third and fourth switching diodes 10, 17 and 18. As a result, the primary tuning circuit 1 is reduced to a first resonance circuit comprising only the first adjustable inductor 5, the first resonance capacitor 6, the first fixed damping resistor 29 and the fifth damping resistor 37 whereas the secondary tuning circuit 2 is reduced to a second resonance circuit comprising only the second adjustable inductor 13, the second resonance capacitor 14 and the second damping resistor 32. With the primary and secondary tuning circuits 1 and 2 reduced as such, the frequency response of the double tuning circuit resembles the characteristic (b) shown in FIG. 8D and the frequency response of an intermediate-frequency signal obtained on the output side of the double tuning comprising only the first adjustable inductor 5, the first resonance capacitor 6, the first fixed damping resistor 29 and the fifth additional capacitor 38 whereas the secondary tuning circuit 2 is reduced to a second resonance circuit comprising only the second adjustable inductor 13, the second resonance capacitor 14 and the second fixed damping resistor 32. With the primary and secondary tuning circuits 1 and 2 reduced as such, the frequency response of the double tuning circuit resembles the characteristic (b) shown in FIG. 8E and the frequency response of an intermediate-frequency signal obtained on the output side of the double tuning circuit is represented by the curve (c) shown in FIG. 8E, an all but flat characteristic in the pass band.

As described above, pieces of on and off information have been written in advance into the table for combinations of all other channels of the VHF high band, all channels of the VHF low band and all channels of the UHF band and the intensities of the electric field of the received signal. To be more specific, a row of the control table of FIG. 9 associated with a type of the information is selected in accordance with the characteristic curve (a) shown in FIGS. 8A to 8E circuit is represented by the curve (c) shown in FIG. 8D, an all but flat characteristic in the pass band.

Now, let the TV tuner receive a signal of a fifth channel in the VHF high band, the VHF low band or the VHF low band with a medium electric-field intensity to give an intermediate-frequency signal as an output of the frequency-conversion unit 3. From the combination of the channel of the signal and the intensity of the electric field, the integrated circuit 22 determines that the intermediate-frequency signal has a frequency response represented by the characteristic curve (a) shown in FIG. 8E which is associated with the information of type 5 written in the control table, generating an off voltage to each of the three output ports BS5, BS7 and BS8 and an on voltage to the output port BS6. The off voltages are applied to the first, third and fourth switching diodes 9, 17 and 18 by way of the first, third and fourth buffer resistors 23, 25 and 26 respectively while the on voltage is applied to the second switching diode 10 by way of the second buffer resistor 24, turning off the first, third and fourth switching diodes 9, 17 and 18 but turning on the second switching diode 10. As a result, the primary tuning circuit 1 is reduced to a first resonance circuit which is determined by the channel and the intensity of the electric field of a signal received by the TV tuner to represent the frequency response of the intermediate-frequency signal output by the frequency-conversion unit 3 and pieces of on and off information for the channel and the intensity of the electric field are written into areas on the selected row of the control table representing one of types 1 to 5 of the information. As a result, from the combination of the channel of the received signal and the intensity of the electric field of the received signal, the integrated circuit 22 can select one of types 1 to 5 of information stored in the control table shown in FIG. 9, generating on and off voltages associated with the selected type to output ports BS5 to BS8 in order to selectively insert and connect the fifth and sixth damping resistors 37 and 40 in parallel to the primary and secondary tuning circuits 1 and 2 respectively and the fifth and sixth additional capacitors 38 and 39 also in parallel to the primary and secondary tuning circuits 1 and 2 respectively. It is thus possible to obtain an intermediate-frequency signal obtained on the output side of the double tuning circuit with a frequency response represented by the curve (c) shown in FIG. 8A, 8B, 8C, 8D or 8E, an all but flat characteristic in the pass band, without regard to the frequency-response characteristic of the intermediate-frequency signal output by the frequency-conversion unit 3.

As described above, according to the present embodiment, the fifth and sixth damping resistors 37 and 40 and the fifth and sixth additional capacitors 38 and 39 are selectively inserted and connected to the double tuning circuit in order to correct the frequency response thereof into a frequency response close to an ideal one. As a result, it is possible to obtain an intermediate-frequency signal obtained on the output side of the double tuning circuit with a frequency response represented by an all but flat characteristic in the pass band, without regard to the frequency-response characteristic of the intermediate-frequency signal output by the frequency-conversion unit 3 which may change from receiving channel to receiving channel or change with the intensity of the electric field dependently on characteristics of components composing the TV tuner.

As described above, pieces of on and off information stored in the control table are classified into types 1 to 5. It should be noted, however, that as type 6, on information for all the output ports BS5 to BS8 and, as type 7, off information for all the output ports BS5 to BS8 can of course be stored in the control table.

As described above in detail, according to the present invention, for each channel and for the magnitude of each voltage of the automatic gain control for the channel, a switching voltage is determined in advance for each switching diode of the double tuning circuit. When the TV tuner receives a signal, a switching voltage determined in advance for the channel receiving the signal and the magnitude of the voltage of the automatic gain control for the channel is supplied to each switching diode in order to selectively connect impedance elements such as damping resistors and resonance additional capacitors in parallel to the primary tuning circuit and/or the secondary tuning circuit. As a result, if the frequency response of the intermediate-frequency signal output by the frequency-conversion unit varies depending upon the channel receiving the signal and the magnitude of the voltage of the automatic gain control for the channel, the frequency response of the double tuning circuit changes to cancel the variations in frequency response occurring in the intermediate-frequency signal output by the frequency-conversion unit so that the intermediate-frequency signal obtained on the output side of the double tuning circuit always has a frequency response close to the ideal one.

What is claimed is:

1. A double tuning circuit of a TV tuner comprising:

a primary tuning circuit including a primary inductor;

a secondary tuning circuit including a secondary inductor, wherein said primary inductor is inductively coupled to said secondary inductor;

wherein said primary tuning circuit includes two series connected circuits, said two series connected circuits including an impedance element and a switching diode;

wherein said secondary tuning circuit includes two series connected circuits, said two series connected circuits including an impedance element and a switching diode;

wherein said two series connected circuits of said primary tuning circuit are connected in parallel with said two series connected circuits of said secondary tuning circuit;

a control circuit for selectively turning on and off each of said switching diodes by using switching voltages corresponding to signal reception states;

wherein each of said impedance elements is a resistive element for Q damping.

2. A double tuning circuit of a TV tuner according to claim 1 wherein said control circuit generates said switching voltages;

said switching voltages corresponding to said signal reception states are determined in advance for each channel receiving a signal, depending on the magnitude of a voltage of automatic gain control for said channel.

3. A double tuning circuit of a TV tuner according to claim 1 wherein said TV tuner further includes a frequency-conversion unit and an intermediate-frequency amplifier unit;

wherein said primary and secondary tuning circuits include an intermediate-frequency filter provided between said frequency-conversion unit and said intermediate-frequency amplifier unit.

4. A double tuning circuit of a TV tuner comprising:

a primary tuning circuit including a primary inductor;

a secondary tuning circuit including a secondary inductor, wherein said primary inductor is inductively coupled to said secondary inductor;

wherein said primary tuning circuit includes two series connected circuits said two series connected circuits including an impedance element and a switching diode;

wherein said secondary tuning circuit includes two series connected circuits, said two series connected circuits including an impedance element and a switching diode;

wherein said two series connected circuits of said primary tuning circuit are connected in parallel with said two series connected circuits of said secondary tuning circuit;

a control circuit for selectively turning on and off each of said switching diodes by using switching voltages corresponding to signal reception states;

wherein said impedance elements are each a resonance capacitive element.

5. A double tuning circuit of a TV tuner according to claim 4 wherein said control circuit generates said switching voltages;

said switching voltages corresponding to said signal reception states are determined in advance for each channel receiving a signal, depending on the magnitude of a voltage of automatic gain control for said channel.

6. A double tuning circuit of a TV tuner according to claim 4 wherein said TV tuner further includes a frequency-conversion unit and an intermediate-frequency amplifier unit;

wherein said primary and secondary tuning circuits include an intermediate-frequency filter provided between said frequency-conversion unit and said intermediate-frequency amplifier unit.

7. A double tuning circuit of a TV tuner comprising:

a primary tuning circuit including a primary inductor;

a secondary tuning circuit including a secondary inductor, wherein said primary inductor is inductively coupled to said secondary inductor;

wherein said primary tuning circuit includes two series connected circuits, said two series connected circuits including an impedance element and a switching diode;

wherein said secondary tuning circuit includes two series connected circuits, said two series connected circuits including an impedance element and a switching diode;

wherein said two series connected circuits of said primary tuning circuit are connected in parallel with said two series connected circuits of said secondary tuning circuit;

a control circuit for selectively turning on and off each of said switching diodes by using switching voltages corresponding to signal reception states;

wherein said impedance elements are a resistive element for Q damping and a resonance capacitive element.

8. A double tuning circuit of a TV tuner according to claim 7 wherein said control circuit generates said switching voltages;

said switching voltages corresponding to said signal reception states are determined in advance for each channel receiving a signal, depending on the magnitude of a voltage of automatic gain control for said channel.

9. A double tuning circuit of a TV tuner according to claim 7 wherein said TV tuner further includes a frequency-conversion unit and an intermediate-frequency amplifier unit;

wherein said primary and secondary tuning circuits include an intermediate-frequency filter provided between said frequency-conversion unit and said intermediate-frequency amplifier unit.

* * * * *